United States Patent [19]

Ardezzone

[11] 4,055,805
[45] Oct. 25, 1977

[54] MULTI-POINT TEST PROBE
[75] Inventor: Frank J. Ardezzone, Santa Clara, Calif.
[73] Assignee: Probe Rite, Inc., Santa Clara, Calif.
[21] Appl. No.: 700,489
[22] Filed: June 28, 1976
[51] Int. Cl.² .......................... G01R 31/02; G01R 1/06
[52] U.S. Cl. ............................... 324/158 P; 324/72.5; 324/158 F
[58] Field of Search ................. 324/158 P, 158 F, 72.5
[56] References Cited
U.S. PATENT DOCUMENTS
3,453,545  7/1969  Oates .................................. 324/72.5
3,891,924  6/1975  Ardezzone et al. .............. 324/158 P Primary Examiner—Rudolph V. Rolinec
Assistant Examiner—Ernest F. Karlsen
Attorney, Agent, or Firm—Boone, Schatzel, Hamrick & Knudsen

[57] ABSTRACT

A multi-point probe head assembly for providing electro-mechanical interface contact with miniature electronic devices and including a rigid support member, a plurality of probe tips each attached to a probe arm, and adjustment means for adjusting the relative position of each probe tip in three orthogonal planes.

12 Claims, 6 Drawing Figures

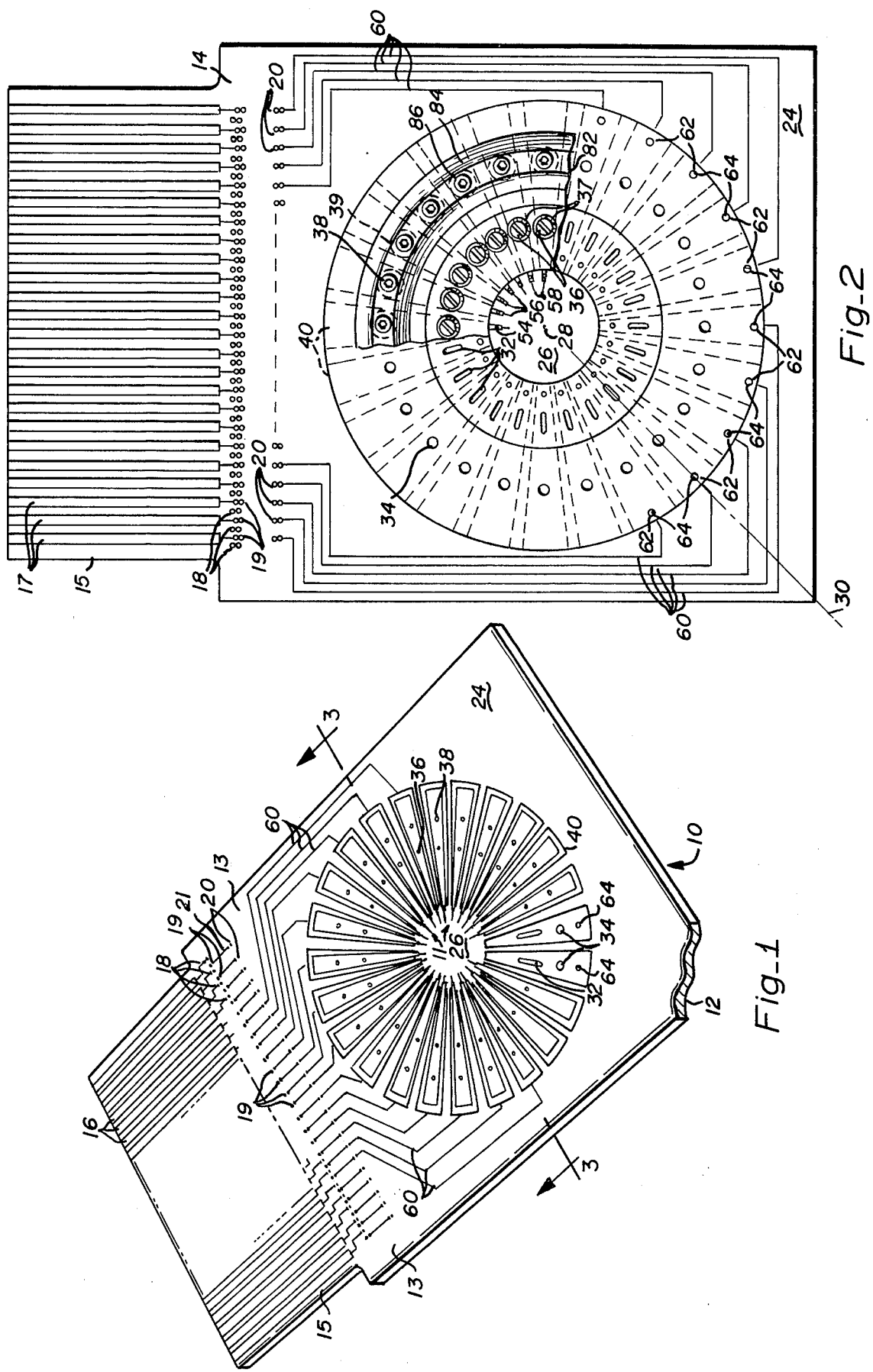

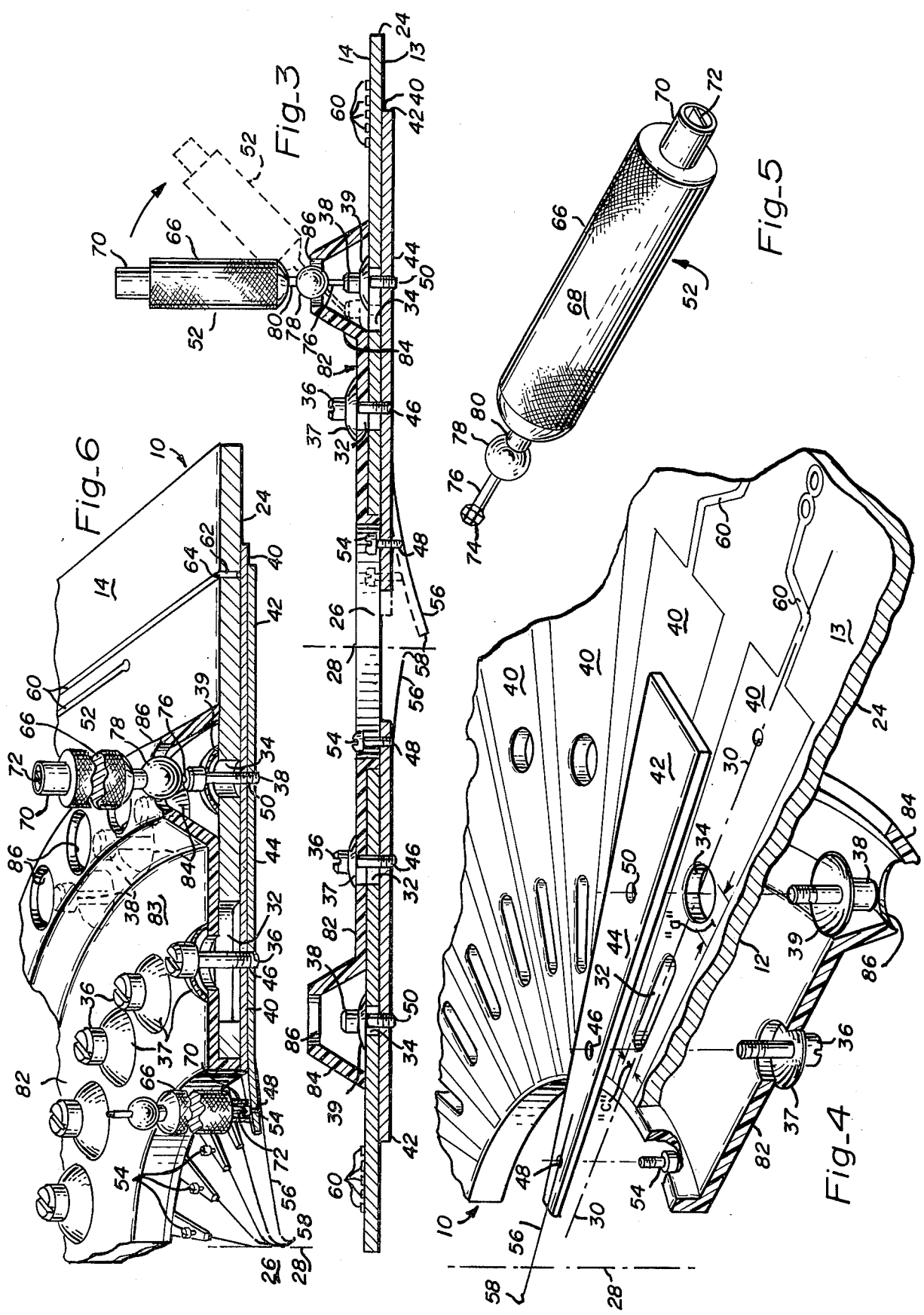

MULTI-POINT TEST PROBE

BACKGROUND OF THE INVENTION

1. Field of the Invention

The present invention relates generally to test probe apparatus and more particularly, to adjustable multi-probe test probe head assemblies for electro-mechanical interface contact with terminals of miniature electronic devices.

2. Description of the Prior Art

The practice of testing electrical characteristics of miniature electronic devices, e.g., semiconductor components, integrated circuit components, micro and printed circuits, etc., is important to the electronic device manufacturer. Testing prior to and after final assembly of the devices is generally conducted to determine performance capabilities and defects. For example, it is desirable to test semiconductor devices while they are in wafer or slice form so as to eliminate unsatisfactory components early in the manufacturing process. For quality assurance, the manufacturer tests the devices after final assembly and prior to shipment. Manufacturers of equipment in which the devices become a part, commonly test the devices prior to installation of the devices in the equipment. In view of the number of tests conducted and the volume demand for miniature electronic devices, there is a continuous need to provide equipment capable of performing these tests accurately and rapidly.

With heretofore adjustable probe heads, the positional adjustment of the probe points is difficult. They generally require use of a trial-and-error process of adjustment of the probe points for each set-up in each of three orthogonal planes. Changing the probe point position in any one of the three planes generally results in a change of the probe point position in one or both of the other planes.

Examples of probe head assemblies of the prior art are disclosed in U.S. Pat. No. 3,832,632 and U.S. Pat. No. 3,891,924, issued to Frank J. Ardezzone, et al; U.S. Pat. No. 3,702,439 granted to McGahey et al; U.S. Pat. No. 3,405,361 granted to L. E. Kattner et al; and U.S. Pat. No. 3,445,770 granted to R. C. Harman.

SUMMARY OF THE PRESENT INVENTION

It is an object of the present invention to provide an improved adjustable multi-point probe head assembly having a simpler and more effective means of positional adjustment of tip contacts than heretofore available.

Briefly, an exemplary embodiment of the multi-point probe head assembly in accordance with the present invention is disclosed. The disclosed assembly is adapted for mounting on a wafer probing machine and includes an electrical interconnect plug for facilitating electrical coupling with electronic test instruments. The plug is formed to a platform which in turn is coupled to a rigid support member. The support member defines a common area in the form of a central opening. Disposed along radial lines emanating from the axis of the central opening are a plurality of angularly spaced rows of openings extending through the support member. A plurality of elongated electrically conductive probe arms are fastened to the support member with each arm in longitudinal alignment with a row of openings. Each arm carries a probe tip contact which projects into the central opening. Fastening means retain each probe arm in position along the associated row of openings. A "joystick" adjustment means is provided for single step adjustment of the probe arms in the "X-Y" plane relative to the rigid support member. Separate adjustment means is provided to allow independent adjustment in the "Z" plane (or planarization) of the probe tip contact relative to the probe arm. Position locking means is provided to retain the position of each probe tip after adjustment.

An advantage of the present invention is that it permits single step adjustment of each of the probe arms in the "X-Y" plane.

A further advantage of the present invention is that it provides positive and independent positioning and locking of each of the probe tips.

These and other objects and advantages of the present invention will become apparent to those of ordinary skill in the art after having read the following detailed description of the preferred embodiment which is illustrated in the several figures of the drawing.

IN THE DRAWING

FIG. 1 is a perspective, partially broken view of the bottom side of a probe head test assembly in accordance with the present invention with two of the probe arms removed;

FIG. 2 is a plan view of the top side of the probe head assembly shown in FIG. 1 with several of the individual probe arms and tip contacts removed;

FIG. 3 is an enlarged cross-sectional view taken along the line 3-3 of the assembly of FIG. 1 including additional parts of the assembly and illustrates two probe tip contacts at different elevations and the interaction between the adjusting tool and the probe arms;

FIG. 4 is an exploded perspective view of a segment of the probe head assembly shown in FIG. 1 illustrating the interrelationship of component parts;

FIG. 5 is an enlarged perspective view of a hand tool for use in making the dimensional adjustments of the probes of the assembly of FIG. 1; and FIG. 6 is a perspective, partially sectioned view of the probe head assembly shown in FIG. 1 and further illustrating the use of the adjustment tool for making three-dimensional adjustments of the probe arm.

DETAILED DESCRIPTION OF THE PREFERRED EMBODIMENT

Referring now to the drawing, a multi-point electrical test probe head assembly in accordance with the present invention is shown in FIGS. 1 and 2 and designated by the general reference character 10. The assembly 10 includes 24 individual probe tip contacts, shown collectively at 11, each of which are adapted to make interface contact with a contact terminal on the electronic device to be tested. The head assembly 10 further includes a rectangularly shaped fibreglass board 12 having a planar bottom side surface 13, and a planar top side surface 14. A portion of one side edge of board 2 is extended to form a plug 15 which carries a plurality of individual conductive fingers 16 arrayed in parallel on the bottom side 13 and a plurality of individual conductive fingers 17 arrayed in parallel on the top side 14 to provide electrical interconnection with electronic test equipment. The assembly is adapted to be mounted on a wafer probing machine (not shown) to provide interface electrical coupling between semiconductor devices to be tested and the test equipment.

A plurality of hole pairs 18 and 19 forming passages through board 12 are provided in a row extending across the plug-side edge of the board. Each finger 16 is extended to encircle one of the hole pairs 18 and each finger 17 is extended to encircle one of the hole pairs 19. Since the fingers 16 and 17 are usually formed by an etching and plating process accomplished after the hole pairs are drilled, the inside bores of the hole pairs may also be conductively plated. Thus, electrical connection to any one of the conductive fingers 16 and 17 may be made from either side. On the bottom side 13 of the board, each plated hole 19 is electrically connected to a terminal 20 by a conductor 21. The terminals 20 are likewise in the form of plated hole pairs to permit electrical connection thereto from either side of the board. The arrangement of conductors 21 permits the selective interruption of the electrical connection between any terminal 20 and its corresponding hole pair 19 by opening (providing a break in) the interconnecting conductor 21.

A rigid planar probe support section 24 is established by board 12 which defines a common central area in the form of a circular opening 26 about a central axis 28. A plurality of rows of openings project through the board 12 within the support section 24. Each row projects along a line in radial alignment with the axis 28 as illustrated by the probe radial line 30 (FIGS. 1, 2 and 4) with the rows angularly spaced apart at 15° increments. The openings of each row include an oblong smooth surface bore 32 and a circular bore 34. The longitudinal axis of the bore 32 is coincident with the line 30 and the center of the bore 34 is in alignment with line 30. The diameter of bore 34 is designated "$a$" and the minor diameter of the bore 32 is designated "$c$".

As best shown in FIG. 3, a threaded securing screw 36 with a Bellville washer 37 projects from the top surface 14 through the oblong bore 32. The diameter of the screw 36 is substantially equivalent to the minor diameter "$c$" of the bore 32 such that minimal lateral deviation is realized while permitting the screw to be urged along the long axis of the opening 32. An Allen-head type screw 38 with a Bellville washer 39 projects through the bore 34. The diameter of the body of the screw 38 is less than the diameter "$a$" of bore 34 to permit screw 38 to be repositioned within the X-Y plane of the bore 34.

About each row of openings in the board 12 are thin film pads 40 of conductive material laminated to the bottom side surface 13. These pads are evenly, axially spaced on board 12 and form a plurality of triangular shaped conductive surfaces (See FIGS. 1 and 4).

Superimposed on each pad 40 is an electrically conductive probe arm 42 which is positioned in longitudinal alignment with a row of openings and includes a planar main support section 44. Each arm 42 carries a plurality of openings including an internally threaded bore 46, an internally threaded bore 48 and an internally threaded bore 50. Bores 46 and 50 are aligned with the bores 32 and 34, respectively, of the rigid support section 24. Threaded bore 48 is positioned near the terminal end of probe arm 42, within opening 26. Probe arms 42 are secured in abutment with pads 40 by the screws 36 and 38 which screw into the threaded bores 46 and 50, respectively. Finite radial and lateral positional adjustments of the probe 42 may be made by manipulation of an adjustment tool 52 (See FIG. 5) as hereinafter described in greater detail.

An elevational adjustment screw 54 is threaded within threaded bore 48 and engages a contact arm 56. Each contact arm 56 is secured about one end of one of the probe arms 42 and carries a tip contact 58 at its terminal end which makes the direct interface contact with the contact points of the device to be tested. Contact arms 56 and tip contacts 59 are formed from a thin resilient wire to allow adjustment of arm 56 and precise contacting with tip 58. The elevation of tip contacts 58 relative to arms 42 is adjusted by turning elevational adjustment screws 54. Accordingly, adjustment of the elevation (planarization) of tip contacts 58 does not interfere with the adjustments of tip contacts 58 in the other two orthogonal planes.

Electrical connection of probe arms 42 with terminals 20 is accomplished through a series of traces 60 running from pads 40 to terminals 20 (See FIGS. 1 and 2). Each trace 60 comprises an elongated film of conductive material laminated to the planar surface of board 12. In the illustrated embodiment, wherein 24 tip contacts 58 are accommodated, 14 of the traces 60 are positioned on the bottom side surface 13 (See FIG. 1) and 10 of the traces are positioned on the top side surface 14 (See FIG. 2). The 14 traces 60 on the bottom side surface 13 form an electrical path directly between the 14 pads 40 and the fourteen centermost terminals 20. The 10 traces 60 on the top side surface 14 connect the outer 10 terminals 20 with the remaining pads 49 by means of a plated film 62 inside the walls of the apertures 64. Apertures 64 are formed within the areas of the 10 pads 40 located furthest from the terminals 20, and project from beneath pads 40 through board 12 to surface 14 (see FIGS. 2 and 6).

Probe head assemblies of embodiment 10 utilize probe arms 42 comprised of a copper alloy, e.g., 9% nickel, 2% tin and 89% copper, with a gold plate, e.g., 100 microinch thickness. The pads 40, traces 60, fingers 16, fingers 17 and conductors 21 are formed of a copper thin film. Hole pairs 18, 19, terminals 20, and film 62 are all copper plated. Pads 40 are also coated with a layer of gold plate, e.g., 100 microinch thickness, to provide a gold-to-gold interface connect with probe arms 42. Additionally, a conductive grease filled with gold and/or silver can be used to interface the probe arms 42 with pads 40. Contact arms 56 and tip contacts 58 are copper alloy in the present embodiment, but they could also be tungsten, platinum alloy or gold alloy, or any other conductive material with acceptable physical and electrical properties.

Referring to FIG. 5, adjustment tool 52 is shown in an oversized view and includes a cylindrical body portion 66 having a knurled surface 68 which is intended to be grasped in the hand of an individual. Projecting from one end and coaxial with body 66 is a hollow cylindrical protrusion 70 containing a flat blade 72 which bisects the inside diameter thereof. Protruding from the opposite end of body 66 is a spherical, hexagonal shaped boss 74 which is attached by a neck 76 to a spherical alignment ball 78. Ball 78 is in turn attached by a neck 80 to body 66.

Referring now to FIG. 6, in making elevational adjustments of an individual probe contact tip 58, cylindrical protrusion 70 of tool 52 is placed over elevational adjustment screw 54 so that blade 72 engages the slot in the head of screw 54. As tool 52 is rotated clockwise or counterclockwise about its axis, adjustment screw 54 moves upward or downward, respectively, in threaded bore 48. Since screw 54 contacts probe tip 58, the movement of screw 54 either upward or downward causes tip 58 to move upward or downward, respectively.

Mounted on the top surface 14 of the probe head assembly 10 is an adjustment guide 82. Guide 82 is circular and concentric with the opening 26 and forms a disc portion 83 and a hollow inverted V-shaped raised portion 84. Disc portion 83 extends from the edge of opening 26 to a point intermediate screws 36 and 38. V-shaped portion 84 is integral with disc portion 83 and forms a cover over the ring of screws 38 with the apex situated directly above screws 38 (see FIGS. 3, 4 and 6). Extending through the raised portion 84 directly above each adjustment screw 38 is an adjustment access aperture 86 of a diameter slightly larger than the maximum diameter of the alignment ball 78 of tool 52. Thus, when boss 74 is inserted through aperture 86 to adjust screw 38, ball 78 is proximate the side walls of aperture 86. While boss 74 is in engagement with the head of the aligned screw 38 a fulcrum effect is realized from the pivot of ball 78 against the sides of aperture 86.

To realize radial and lateral adjustments of the individual probe positions, tool 52 is inserted through aperture 86 so that the hexagonal head shaped boss 74 mates with the hexagonal head shaped slot of adjustment screw 38. Rotating the tool 52 in a counterclockwise direction loosens adjustment screw 38 so that the position of the probe tip in the X-Y plane may be altered. Tool 52 functions similar to that of the "joystick" with the ball 78 capable of forming a fulcrum point at any point about the circumference of aperture 86.

Referring now to FIGS. 3 and 6, translation of the upper portion of tool 52 along the radial line 30 of probe arm 42 (as shown in dashed lines in FIG. 3) causes probe arm 42, the attached contact arm 56 and probe tip 58 to move a proportionate length in the direction opposite to the movement of the upper portion of tool 52, and also causes securing screw 36 to move along the long axis of bore 32. Similarly, translation of the upper portion of the tool 52 perpendicular to radial line 30 causes probe arm 42 to pivot around securing screw 36 resulting in translation of contact tip 58 an amount proportional to the translation of the upper portion of tool 52. This translation is in the same direction as the translation of the upper portion of tool 52. Thus, radial and lateral adjustment of probe tip 58 is achieved by a single adjustment means. Once the desired position of tip 58 is realized, adjustment screw 38 is tightened by rotating tool 52 clockwise about its axis to secure that position.

To incorporate probe head assembly 10 for testing integrated circuit devices, assembly 10 is mounted on a probing machine (not shown) and the device under test is placed on the machine chuck. The chuck and assembly 10 are moved relative to one another to position the individual tip contacts 58 in alignment with the contact points of the device under test. Through a microscope, the elevational, radial and lateral positions of the individual tip contacts 58 relative to the device are observed. Positional adjustments of the individual probe arms 42 are made so that the pattern of the tip contacts 58 coincides with the pattern of the contact points of the device. If there are more tip contacts 58 than contact points on the device to be tested, the unnecessary tip contacts are elevationally adjusted by screws 54 so as not to contact the device under test.

The test probe head assembly 10 is further adapted such that additional components may be interconnected with the assembly if desired. Hole pairs 19 and terminals 20 may be readily joined in series or parallel with other components or interconnected to other hole pairs 19. Further, the conductors 21 connecting hole pairs 19 and terminals 20 may be opened if desired.

Although a single preferred embodiment of the present invention has been disclosed, it is contemplated that various modifications and alterations of the invention will become apparent to those skilled in the art after having read the foregoing description. Accordingly, it is intended that the description not be considered limiting, and that the appended claims be interpreted to cover all alterations and modifications which fall within the true spirit and scope of the invention.

What is claimed is

1. A probe head assembly for use in testing miniature electronic devices, and comprising.

an electrically insulating board having a planar first surface, a planar second surface and an aperture formed in a generally central portion thereof;

a first plurality of electrically conductive contact strips disposed upon at least one of said surfaces and arrayed along an edge of said board to form a board interconnect means;

a plurality of probe means each including an elongated body disposed upon said first surface and oriented along a radial line extending outwardly from the center of said aperture, said probe means being affixed to said board by pivot means which permit said probe means to be rotated thereabout in the plane of said first surface and to be moved along said radial lines, each of said probe means further including a contact means affixed to the end of said body nearest said aperture;

a plurality of electrical conductors respectively coupling said probe means to different ones of said first contact strips;

support means having a form concentric with said aperature attached to said board, said support means having a raised portion having a hollow inverted generally V-shaped cross-section, a circular guide supported by the support means attached in concentric relation to said aperature, said circular guide having means forming a fulcrum above each probe means; and elongated lever means including a first end portion for insertion within said raised portion and having means for drivably engaging one of said probe means, said lever means further having a mid-portion for engaging said fulcrum and a second end portion forming an elongated handle, whereby said lever means is movable about said fulcrum to cause said probe means to be moved along said radial lines and pivotally about said pivot means to selectively position said contact means beneath said aperture.

2. A probe head assembly as recited in claim 1 wherein said contact means includes an elongated length of flexible conducting material with one end extending parallel to the length of said elongated body and beyond the end thereof and terminating in a contact tip, said probe means further including means for raising said contact tip relative to said body.

3. A probe head assembly for use in testing miniature electronic devices, and comprising.

an electrically insulating board having a planar first surface, a planar second surface and an aperture formed in a generally central portion thereof;

a first plurality of electrically conductive contact strips disposed upon at least one of said surfaces and arrayed along an edge of said board to form a board interconnect means;

a plurality of probe means each including an elongated body disposed upon said first surface and oriented along a radial line extending outwardly from the center of said aperture, said probe means being affixed to said board by pivot means which permit said probe means to be rotated thereabout in the plane of said first surface and to be moved along said radial lines, each of said probe means further including a contact means affixed to the end of said body nearest said aperture, and each of said bodies includng a coupling member for mating with a lever means;

a plurality of electrical conductors respectively coupling said probe means to different ones of said first contact strips;

means forming a fulcrum above each probe means, said means forming a fulcrum including a support having an inverted substantially V-shaped cross-section and a circular plate having openings disposed above each said coupling member, said circular plate being supported by said support, and elongated lever means including a first end portion having means for drivably engaging one of said probe means, a mid-portion for engaging said fulcrum, and a second end portion forming an elongated handle, said lever means being movable about said fulcrum to cause said probe means to be moved along said radial lines and pivotally about said pivot means to selectively position said contact means beneath said aperture.

4. A probe head assembly as recited in claim 3 wherein said mid-portion of said lever means is of a spherical configuration with a diameter slightly smaller than said openings.

5. A probe head assembly as recited in claim 3 wherein said circular plate is affixed to said second surface and said board includes apertures therein lying beneath said openings enabling said coupling member to extend through said board for engagement with said lever means.

6. A probe head assembly as recited in claim 1 wherein said board has an elongated aperture formed therein and said pivot means includes a pivot pin affixed to said board and extending through said elongated aperture.

7. A probe head assembly as recited in claim 6 wherein said pivot pin includes adjustable means for clampingly engaging said body to fix said body in position relative to said board.

8. A probe head assembly as recited in claim 7 wherein said adjustable means includes a threaded aperture formed in said body and a mating threaded member having a board engaging head, said head and the distal end of said handle being adapted to mate with each other so that said lever means may also be used to adjust said threaded member.

9. A probe head assembly as recited in claim 1 wherein said electrical conductors are printed circuit metallic strips having enlarged portions lying directly beneath said elongated bodies for engagement thereby independent of the positions of said bodies.

10. A probe head assembly as recited in claim 1 wherein said one half of said contact strips are disposed on said first surface and the other half of said contact strips are disposed on said second surface.

11. A probe head assembly as recited in claim 1 wherein said contact means is in the form of a contact arm secured at one of its ends to one of said elongated bodies at a position intermediate the ends of the elongated body, an elevational adjustment member protruding through an aperture in the elongated body and engaging the contact arm at a position intermediate the ends of the contact arm.

12. The probe head assembly as recited in claim 11 wherein the elevational adjustment member is in the form of a threaded screw and the aperture in the elongated body is threaded to mate with the threads of said screw.

* * * * *